(12) United States Patent
Kerrigan et al.

(10) Patent No.: US 7,690,927 B1
(45) Date of Patent: Apr. 6, 2010

(54) PROCESSOR SCALING ACROSS MULTIPLE COMPUTER BLADES

(75) Inventors: Brian M. Kerrigan, Cary, NC (US);
Justin P. Bandholz, Cary, NC (US);
Martin J. Crippen, Apex, NC (US);
Andrew S. Heinzmann, Apex, NC (US);
Joseph E. Maxwell, Cary, NC (US);
Edward J. McNulty, Raleigh, NC (US);
Pravin Patal, Cary, NC (US); Tony C. Sass, Fuquay Varina, NC (US); Phillip L. Weinstein, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/407,206

(22) Filed: Mar. 19, 2009

(51) Int. Cl.
*H01R 12/00* (2006.01)
(52) U.S. Cl. .................. 439/74; 439/61; 439/248; 439/511; 361/735
(58) Field of Classification Search ................ 439/74, 439/61, 248, 511, 65, 928; 361/735, 790, 361/732
See application file for complete search history.

(56) References Cited

U.S. PATENT DOCUMENTS

| | | | | |
|---|---|---|---|---|
| 4,717,344 | A * | 1/1988 | Schempp et al. | 439/61 |
| 4,950,178 | A * | 8/1990 | Harvey et al. | 439/507 |
| 5,234,348 | A * | 8/1993 | Konsevich et al. | 439/61 |
| 5,311,408 | A * | 5/1994 | Ferchau et al. | 361/818 |
| 5,385,481 | A * | 1/1995 | Kotyuk | 439/378 |
| 5,388,995 | A * | 2/1995 | Rudy et al. | 439/61 |
| 5,402,320 | A * | 3/1995 | Kielstra et al. | 361/796 |
| 5,706,179 | A * | 1/1998 | Palatov | 361/788 |
| 5,788,510 | A * | 8/1998 | Walker | 439/61 |
| 6,077,090 | A | 6/2000 | Campbell et al. | |
| 6,244,881 | B1 * | 6/2001 | Hara | 439/188 |
| 6,350,130 | B1 * | 2/2002 | Eller | 439/61 |
| 6,431,879 | B2 | 8/2002 | Brekosky et al. | |
| 6,520,789 | B2 | 2/2003 | Daugherty, Jr. et al. | |
| 6,612,851 | B1 | 9/2003 | Goodwin et al. | |

(Continued)

OTHER PUBLICATIONS

Franch Delattre, "report: Intel Nehalem Architecture", www.behardware.com/articles/733-5/report-nehalem-architecture, Jan. 22, 2009, pp. 1-2.

(Continued)

*Primary Examiner*—Gary F. Paumen
(74) *Attorney, Agent, or Firm*—Cynthia G. Seal; Jeffrey L. Streets

(57) ABSTRACT

A scalability card for use with a plurality of computer blades. The computer blades are releasably securable in a parallel configuration, wherein each blade includes a circuit board and a processor operatively coupled to the circuit board. Each processor is in electronic communication with a scalability connector on a floating plate that is loosely secured to the computer blade. Furthermore, each scalability connector is preferably disposed in a common plane extending perpendicular to the plurality of parallel computer blades. The scalability card includes a plurality of electronically interconnected scalability connectors arranged for rough alignment with the scalability connectors of each computer blade. In addition, the scalability card preferably includes at least one alignment feature for engaging each floating plate and, therefore, providing fine alignment of the scalability connector on each floating plate to one of the scalability connectors of the scalability card.

20 Claims, 6 Drawing Sheets

U.S. PATENT DOCUMENTS

| | | | |
|---|---|---|---|
| 6,814,582 B2 * | 11/2004 | Vadasz et al. | 439/61 |
| 6,926,537 B1 | 8/2005 | Auchincloss et al. | |
| 6,935,868 B1 * | 8/2005 | Campini et al. | 439/67 |
| 6,966,784 B2 * | 11/2005 | Van Schuylenbergh et al. | 439/67 |
| 6,974,333 B2 | 12/2005 | Wildes et al. | |
| 2008/0045044 A1 | 2/2008 | Yi | |
| 2008/0176420 A1 * | 7/2008 | Weintraub | 439/67 |
| 2008/0200043 A1 * | 8/2008 | Yeh | 439/67 |
| 2009/0156031 A1 * | 6/2009 | Staiger et al. | 439/151 |

OTHER PUBLICATIONS

White Paper "INTEL QuickPath Architecture" www.intel.com/technology/quickpath, 2008, pp. 1-6.

* cited by examiner

PROCESSOR SCALING ACROSS MULTIPLE COMPUTER BLADES

BACKGROUND OF THE INVENTION

1. Field of the Invention

The present invention relates to processor scaling between processors in separate chassis.

2. Background of the Related Art

Processors may be interconnected to achieve greater performance. The greater performance may include faster memory access or increased data handling capacity. An interconnection between two or more processors may be referred to as a bus, such as with the front side bus (FSB), or a point to point interconnect, such as with the Intel Corporation's QUICK PATH INTERCONNEC™ (QPI). When an interconnection is made between processors, the processors are referred to as being scaled and a cable used to complete the interconnection is referred to as a scalability cable.

Processor scalability requires a high signal quality electrical connection between the processors. When the processors being scaled are mounted on the same circuit board, such electrical connection may be made with conductive traces that extend from the socket for one processor to the socket for another processor. However, when the processors being scaled are located in different housings, the electrical connection must be allow for mechanical compliance of each housing. For example, mechanical compliance is required to allow each housing to be properly inserted into a chassis and also to resist damage from shock and vibration.

BRIEF SUMMARY OF THE INVENTION

One embodiment of the present invention provides a system that comprises a scalability card for use with a plurality of computer blades. The plurality of computer blades is releasably securable in a parallel configuration, wherein each computer blade includes a circuit board and at least one processor operatively coupled to the circuit board. Each processor is in electronic communication with a scalability connector on a floating plate that is loosely secured to the computer blade. Furthermore, each scalability connector is preferably disposed in a common plane extending perpendicular to the plurality of parallel computer blades. The scalability card includes a plurality of electronically interconnected scalability connectors arranged for rough alignment with the scalability connectors of each computer blade. In addition, the scalability card preferably includes at least one alignment feature for engaging each floating plate and, therefore, providing fine alignment of the scalability connector on each floating plate to one of the scalability connectors of the scalability card.

Another embodiment of the invention provides a method for processor scaling across a plurality of computer blades. The method includes providing a plurality of computer blades, wherein each computer blade has a circuit board, a processor operatively connected to the circuit board, and a scalability connector that lies in a plane perpendicular to the computer blade. The plurality of computer blades are releasably secured together with the scalability connector of each computer blade aligned along an edge of the computer blades. A scalability card is releasably secured across each of the scalability connectors of the computer blades, wherein the scalability card includes scalability connectors for coupling with each of the scalability connectors of the computer blades and electronically conductive interconnections between the scalability connectors on the scalability card.

DETAILED DESCRIPTION OF THE INVENTION

Figure 1:
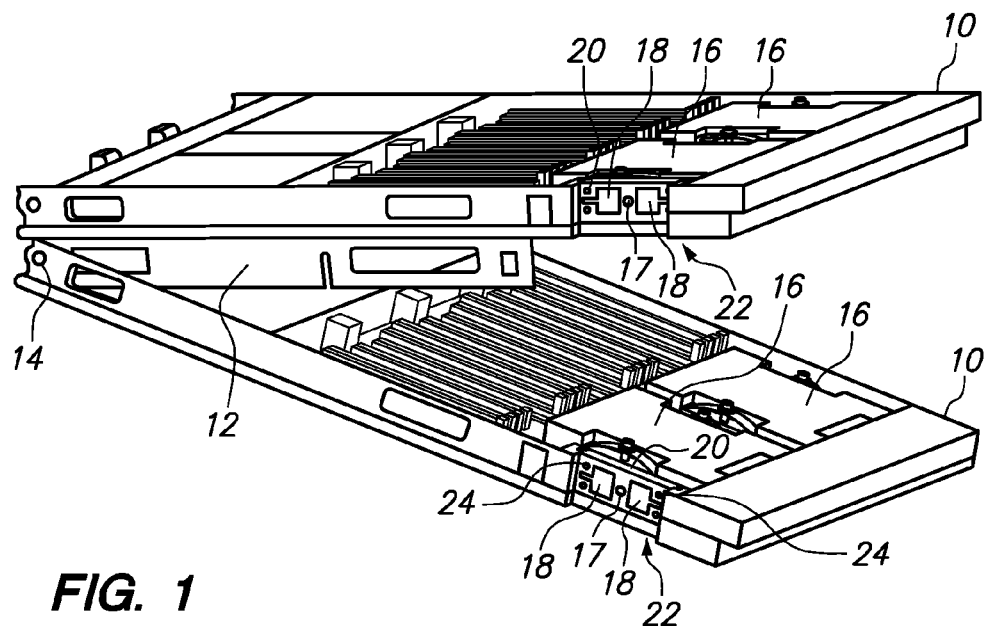
FIG. 1 is a perspective view of two similar computer blades being secured together.

One embodiment of the present invention provides a system that comprises a scalability card for use with a plurality of computer blades. The plurality of computer blades is releasably securable in a parallel configuration, wherein each computer blade includes a circuit board and at least one processor operatively coupled to the circuit board. Each processor is in electronic communication with a scalability connector on a floating plate that is loosely secured to the computer blade. Furthermore, each scalability connector is preferably disposed in a common plane extending perpendicular to the plurality of parallel computer blades. The scalability card includes a plurality of electronically interconnected scalability connectors arranged for rough alignment with the scalability connectors of each computer blade. In addition, the scalability card preferably includes at least one alignment feature for engaging each floating plate and, therefore, providing fine alignment of the scalability connector on each floating plate to one of the scalability connectors of the scalability card.

Electronic interconnections provided between the scalability connectors on the scalability card establish one or more communication bus between the processors of the computer blades. Although the one or more communication bus may include a front side bus, the scalability card preferably establishes point-to-point processor interconnects, such as with Intel's QuickPath Interconnect (QPI) or AMD's HyperTransport (HT).

The scalability connectors themselves may include various types of connectors, but are preferably "LGA to LGA" or "hybrid LGA" style high density connectors. An "LGA to LGA" style connector must be held in place, such as using a screw. However, a "hybrid LGA" style connector uses solder balls on one side of the connection to facilitate soldering to an LGA on the other side of the connection. The term "grid array connector" is used in this description to include both "LGA to LGA" and "hybrid LGA" style high density connectors, as well as alternative connectors that are based on two-dimensional arrays of contacts.

In an additional embodiment, the scalability connectors of the computer blades are formed on a flex cable. Accordingly, one end of the flex cable is electronically connected to the circuit board securing the processors. The flex cable extends around the floating plate and a second end of the flex cable is secured to the floating plate and forms a scalability connector. Optionally, the second end of the flex cable is secured to the floating plate with screws.

The scalability card may include any number of scalability connectors for interconnecting processors between computer blades. In one embodiment, each computer blade includes two processors and two scalability connectors, such as one LGA connector in direct communication with each of the two processors. Accordingly, the scalability card may include 4, 6 or 8 scalability connectors for scaling the processors from 2, 3 or 4 computer blades. A scalability card could include a greater number of scalability connectors if desired.

In another embodiment, each scalability connector of the computer blade is linearly aligned in the common plane in which the scalability connector is disposed. Providing the connectors in a common plane enables them to be connected using a flat scalability card and providing the connector in alignment enables the scalability card to be compact and efficient. Preferably, each scalability connector of the computer blades faces outwardly from the computer blade along one edge so that the scalability card may be secured easily from one side of the plurality of computer blades. Still further, each of the scalability connectors on the plurality of computer blades most preferably faces outwardly from the computer blade in a recess formed along one edge. In this manner, the scalability card may be secured across the plurality of computer blades without extending beyond the edge of the computer blades. Because the scalability card does not increase the overall dimensions of the computer blades, the scaled computer blades may be collectively received into an existing chassis that is intended for a plurality of the individual computer blades.

Where the connections between the scalability connectors are not soldered, fasteners should be used to independently bias each floating plate against the scalability card. A preferred fastener is a screw or bolt. Furthermore, the scalability card may include printed circuit board backed by a load plate to prevent bowing of the card. Optionally, leaf springs may be disposed between the fasteners and the load plate to distribute pressure to the edges of the load plate.

In yet another embodiment, the alignment features of the scalability cards are pins that engage holes in the floating plates. The pins may be tapered to assist the pins entering the holes, then biasing the floating plates within the plane to move upward, downward, left, right, or combinations thereof. Accordingly, each of the floating plates and the corresponding scalability connector(s) is aligned with a scalability connector on the scalability card. This manner of aligning the floating plates may be considered to be independent alignment since each of floating plates may be moved in different directions and/or different distances. The directions and distances defining the amount of float depends upon the design of the floating plate in cooperation with the design of a bracket securing the floating plate. In a specific embodiment, the floating plate is allowed to move no more than 3 mm from side to side and no more than 3 mm upward or downward.

Another embodiment of the invention provides a method for processor scaling across a plurality of computer blades. The method includes providing a plurality of computer blades, wherein each computer blade has a circuit board, a processor operatively connected to the circuit board, and a scalability connector that lies in a plane perpendicular to the computer blade. The plurality of computer blades are releasably secured together with the scalability connector of each computer blade aligned along an edge of the computer blades. A scalability card is releasably secured across each of the scalability connectors of the computer blades, wherein the scalability card includes scalability connectors for coupling with each of the scalability connectors of the computer blades and electronically conductive interconnections between the scalability connectors on the scalability card. Optionally, the method further includes allowing the scalability connector of each computer blade to float within the plane, and urging each scalability connector to independently float into alignment with one of the scalability connectors on the scalability card.

FIG. 1 is a perspective view of two similar computer blades 10 being secured together. In the embodiment illustrated here, an interface plate 12 is added to the upper blade 10 to provide a pivotal connection 14 at one end of the two blades 10. Other than the interface plate 12, the blades 10 have sufficient similarity to be interchangeably positioned, such as in a chassis for receiving multiple blades. Still, the exact components within each blade 10 may be different. As shown, each blade 10 includes two processors 16 in communication with a flex cable 17 having two scalability connectors 18 that enable the processors to be interconnected with processors on other blades. The scalability connectors 18 are secured to a floating plate 20 that is disposed in a plane that is perpendicular (at a right angle) to the circuit board that operatively secures the processors 16. Accordingly, the scalability connectors 18 face outwardly along an edge of each blade, most preferably in a recess 22. Because the floating plate 20 is loosely secured to the blade, such as two ends of the floating plate being set within tracks 24, the floating plate 20 may move a short distance up, down, right or left to accommodate alignment with a scalability card.

Figure 2A:
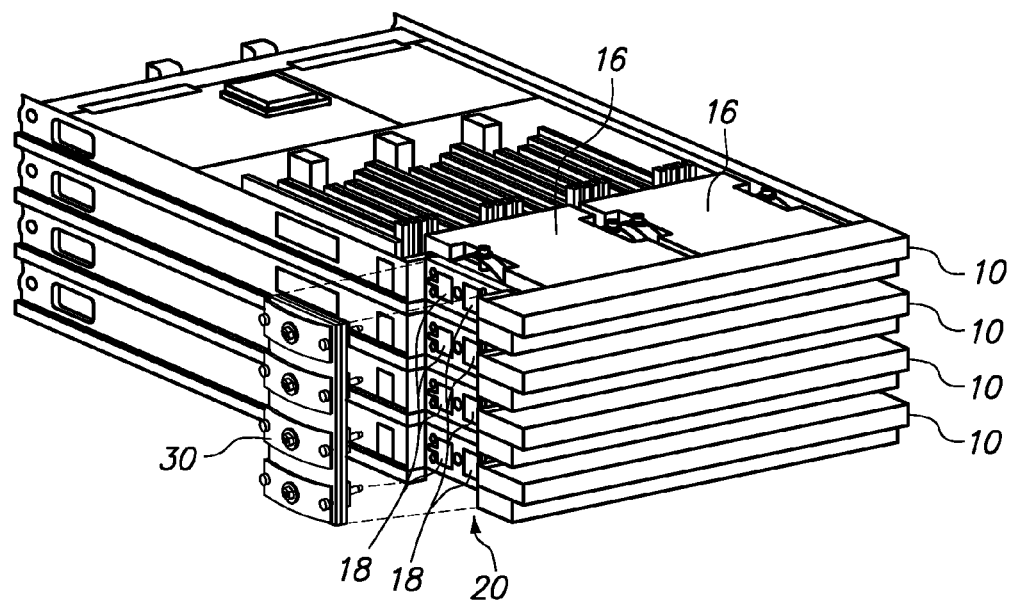
FIGS. 2A-B are perspective views of four similar computer blades secured in a parallel configuration with scalability connectors aligned to be coupled to a scalability card.
Figure 2B:
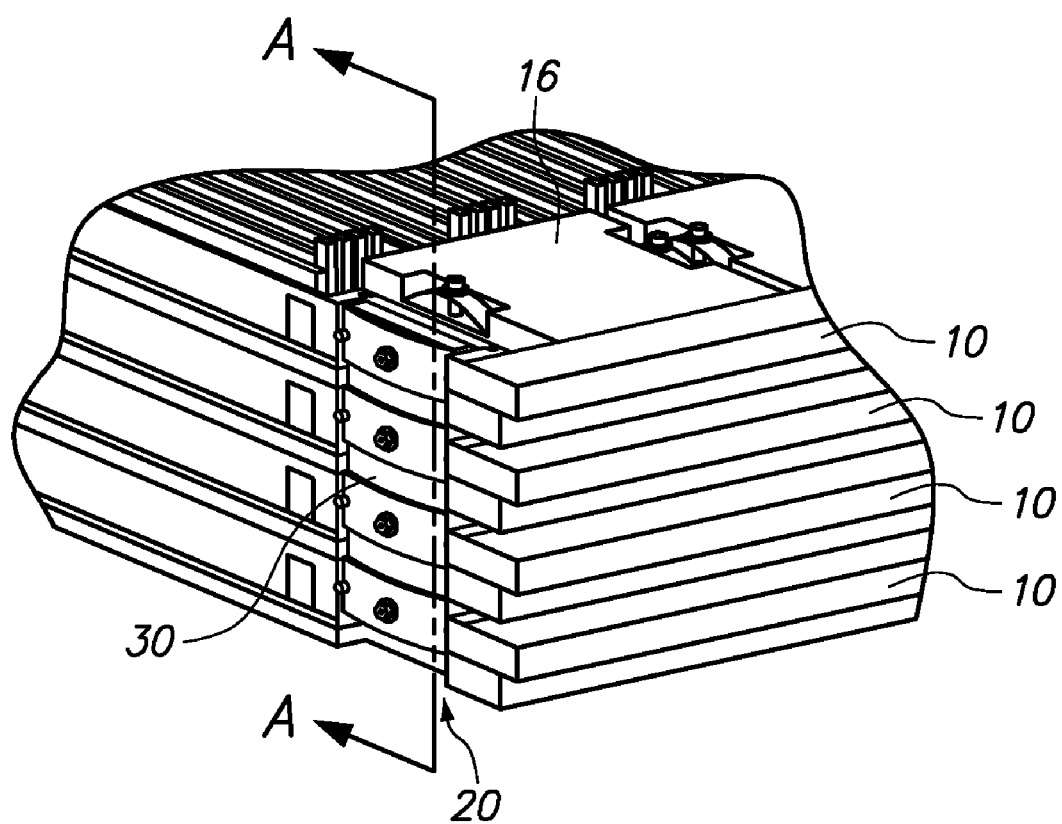

FIG. 2A is a perspective view of four similar computer blades 10 each secured in a parallel configuration with scalability connectors 18 aligned in the recess 20 to be coupled to a scalability card 30. The scalability card 30 includes scalability connectors that align with and engage the scalability connectors 18 of each blade 10. Referring to FIG. 2B, the scalability card 30 is shown in its installed position within the recess 20 formed by the four blades 10. Greater detail of the engagement between the scalability card 30 and each blade 10 is provided below with reference to FIGS. 3 and 4.

Figure 3:
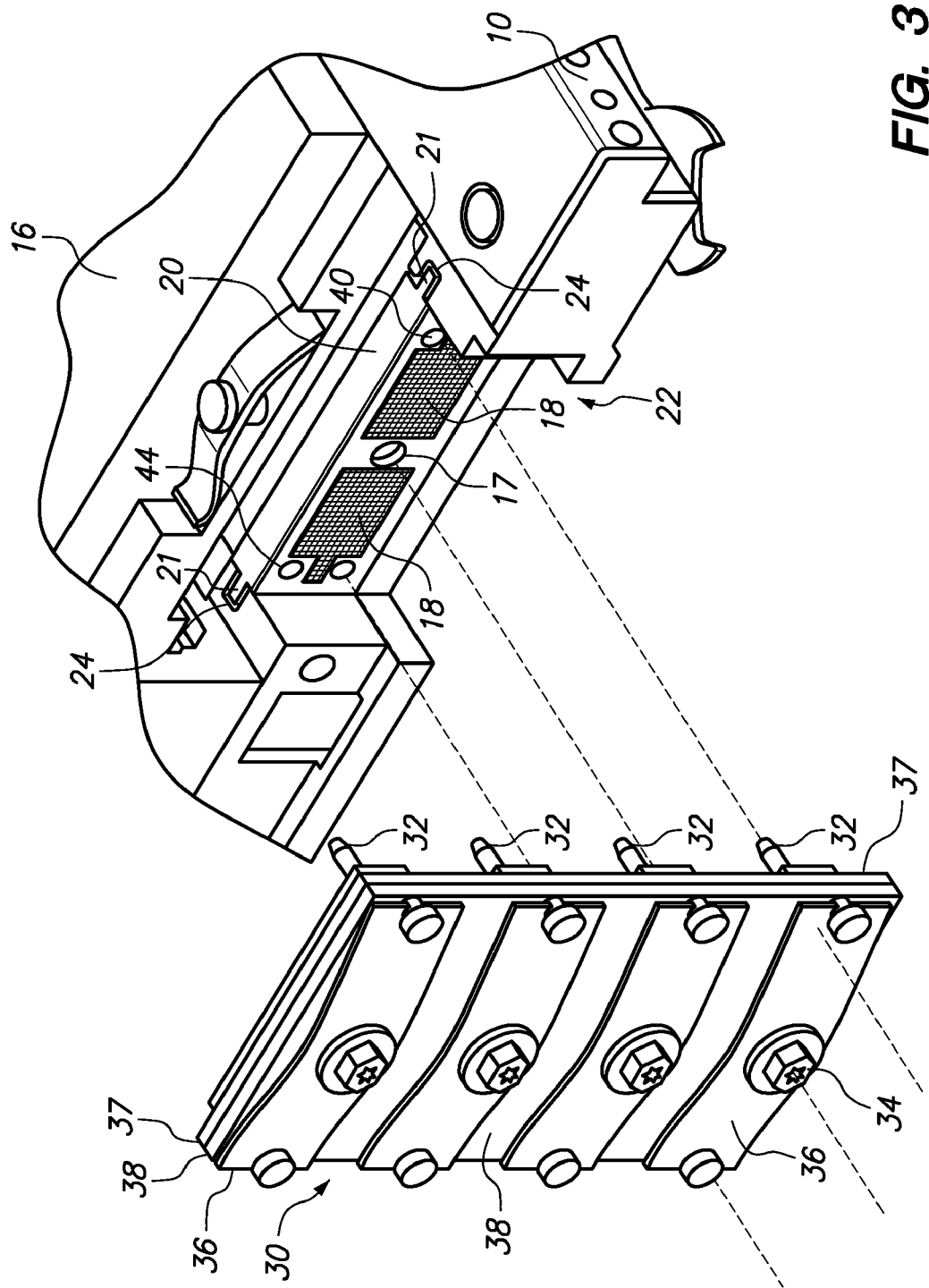
FIG. 3 is a perspective view of a scalability card having alignment pins that provide fine alignment of the scalability connectors of the computer blade with the scalability connectors on the scalability card.

FIG. 3 is a perspective view of the scalability card 30 having alignment pins 32 that provide fine alignment of the scalability connectors 18 of the computer blade 10 with scalability connectors on the scalability card 30. The lower alignment pin 32 is shown in alignment with an alignment hole 40 that is formed through the flex cable 17 and the floating plate 20. If the scalability connectors are not going to be soldered, a screw 34 may be aligned with a threaded hole 42 for fastening the floating plate 20 to the scalability card 30. The screw 34 may have a head that engages a leaf spring 36 that transfers the load from the screw head to the sides of a backing plate 38. A circuit card 37 is supported against the backing plate 38 to provide rigidity to the card and prevent the card from bowing.

On the blade 10, the region of the flex cable 17 that includes the scalability connectors 18 is secured to the floating plate 20 with a pair of screws 44. The floating plate 20 has its ends 21 loosely received in tracks 24 secured to the housing of the blade 10. Preferably, the floating plate 20 remains in a plane perpendicular to the circuit board of the blade, but is allowed to float or move within the plane a few millimeters in any direction. It should also be noticed that the floating plate 20 is in a recessed position, where the depth of the recess 22 allows installation of the scalability card 30 without interfering with the installation of the blade into a chassis.

Figure 4:
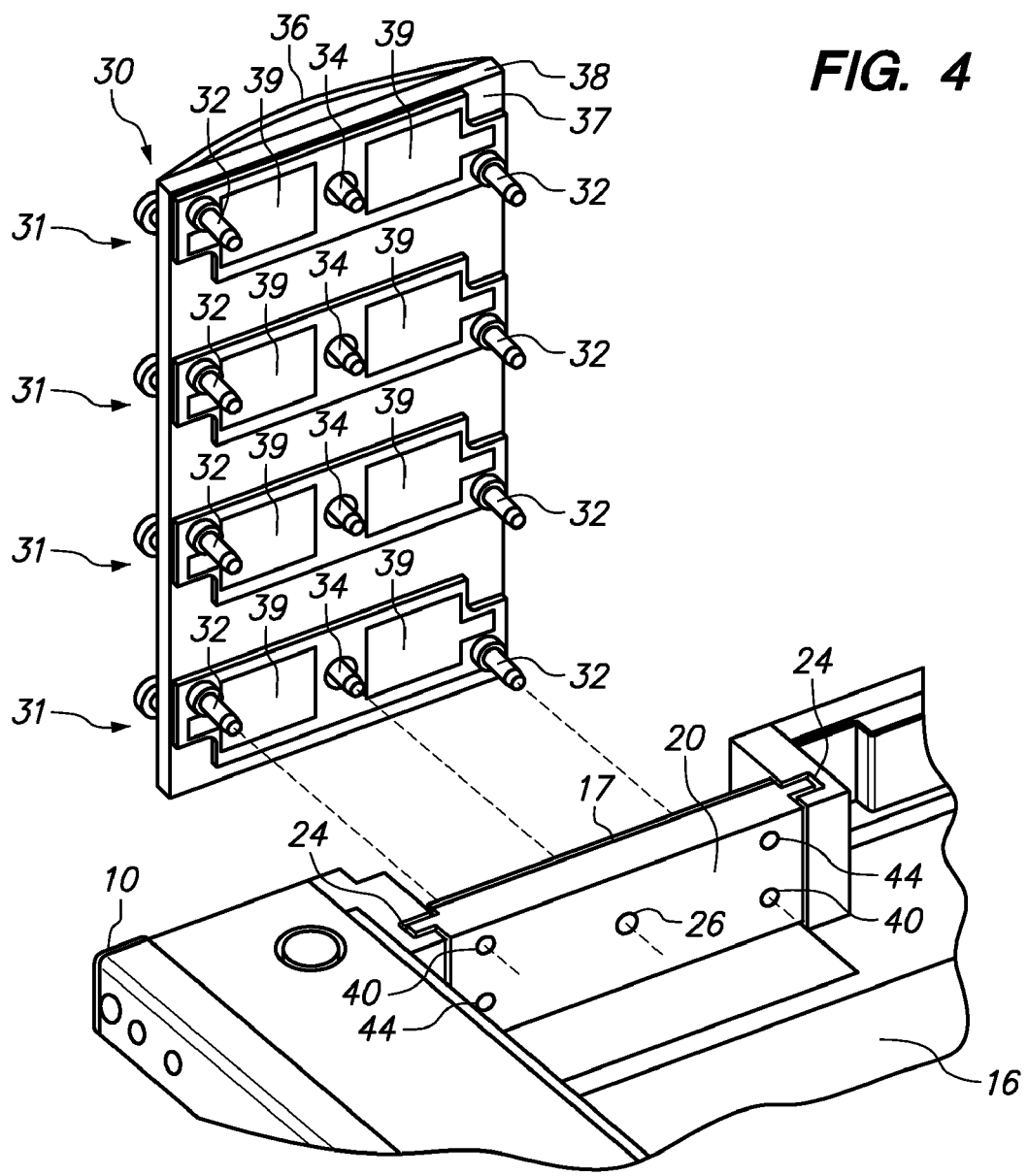
FIG. 4 is a perspective view of the scalability card in FIG. 3 from a reverse angle to further show that the alignment pins cause independent alignment of the floating plate and the scalability connectors secured to the plate.

FIG. 4 is a perspective view of the scalability card 30 in FIG. 3 from a reverse angle to further show that the alignment pins 32 cause independent alignment of the floating plate 20 (which secures the scalability connectors 18 shown in FIG. 3) with one or more of the scalability connectors 39 secured or formed on the circuit card 37. The scalability card 30 is manually positioned so that the alignment pins 32 are generally aligned to be received in the alignment holes 40 of the floating plate 20 and the screw 34 is generally aligned to be threadably received in the threaded hole 26. Since the vertical spacing between each connector assembly 31 (here including two alignment pins 32, a screw 34 and two connectors 39) is fixed, any misalignment of each floating plate 20 with each connector assembly 31 requires that the floating plate 20 move within the tracks 24 to align with the connector assembly 31. In this manner, each of the scalability connectors 18 (See FIG. 3) on the floating plate 20 is accurately aligned for coupling with an opposing scalability connector 39 on the scalability card 30.

Figure 5A:
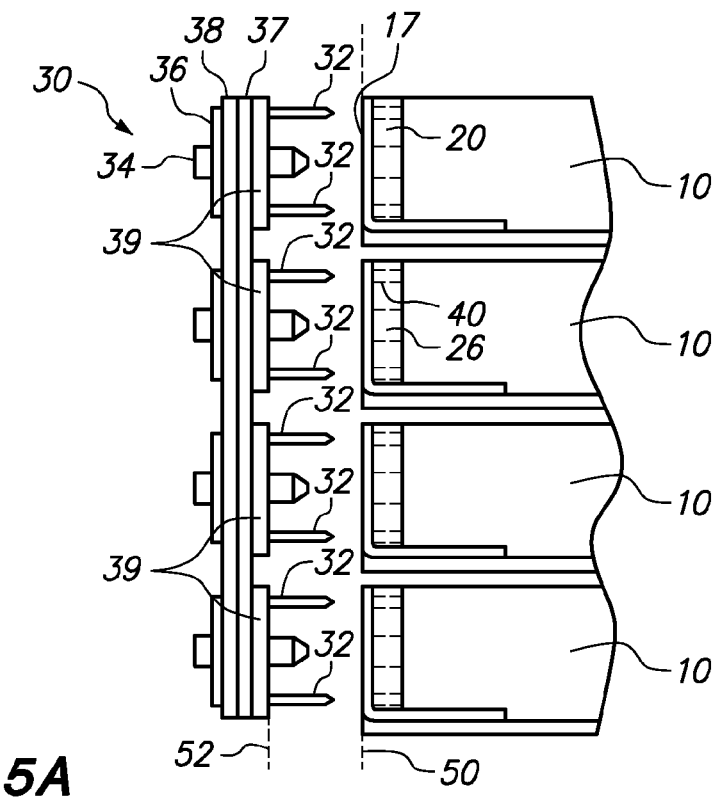
FIG. 5A is a side view of the scalability card with alignment pins roughly aligned with the alignment holes in the floating plate.

FIG. 5A is a schematic side view (taken along line A-A in FIG. 2B) of the scalability card 30 with alignment pins 32 roughly aligned with an equal number of alignment holes 40 in the floating plate 20. The scalability connectors 17 lie in a common plane 50 as a result of the blades 10 being secured together. Similarly, the opposing scalability connectors 39 on the scalability card 30 lie in a plane 52 as a result of the planar circuit card 37 and backing plate 38.

Figure 5B:
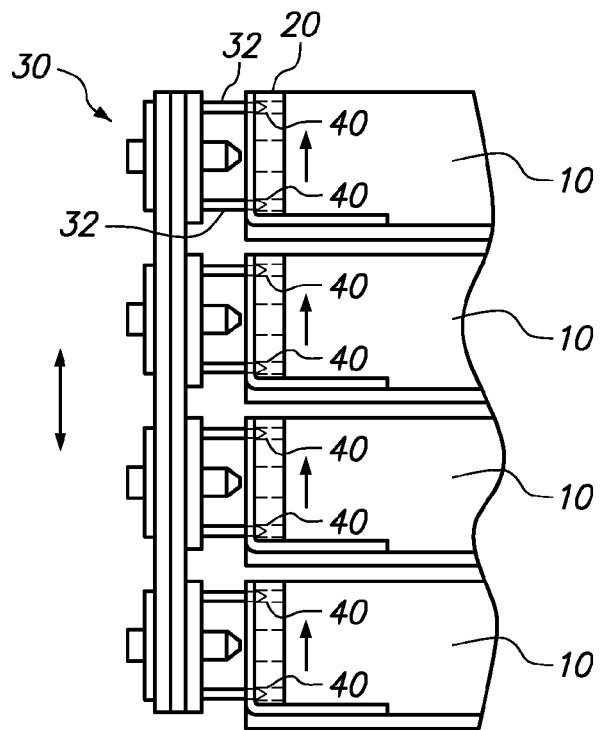
FIG. 5B is a side view as in FIG. 5A, except that the alignment pins have been inserted into the alignment holes to cause fine alignment of each floating plate with the scalability card.

FIG. 5B is a schematic side view as in FIG. 5A, except that the alignment pins 32 have been inserted into the alignment holes 40 to cause fine alignment of each floating plate 20 with the scalability card 30. Specifically, any misalignment present during initial alignment (as in FIG. 5A) between any one of the floating plates 20 and the opposing alignment pins 32 will, upon insertion of the pins 32, cause the alignment pin 32 to bias the floating plate 20 to move within the plane 50 until fine alignment is achieved. Since all of the alignment pins 32 have now entered the corresponding alignment holes 40, fine alignment has been achieved and the scalability card 30 may then be secured in place.

Figure 5C:
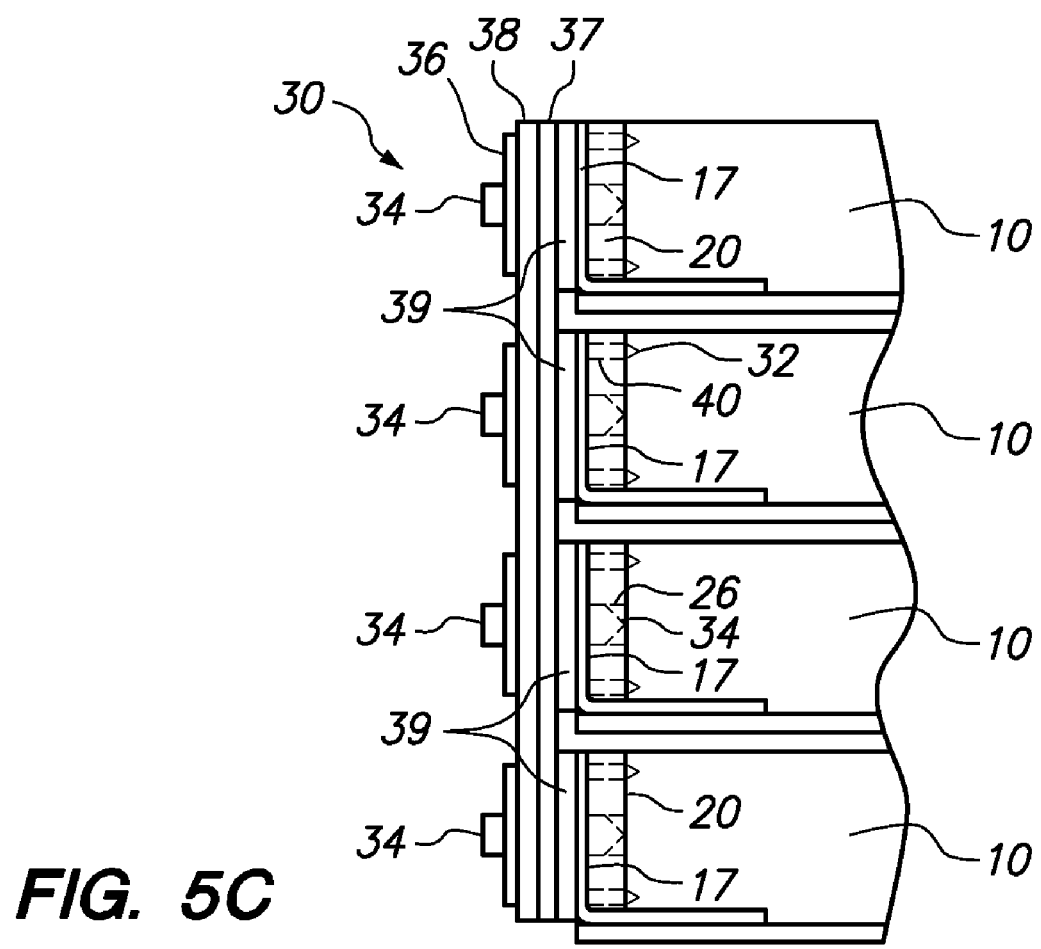
FIG. 5C is a side view as in FIG. 5B, except that the screws have been tightened so that the aligned floating plates are each biased toward the scalability card so that the scalability connectors of the computer blade are in operative contact with the scalability connectors on the scalability card.

FIG. 5C is a schematic side view as in FIG. 5B, except that the screws 34 engage the threaded holes 26 and have been tightened so that the aligned floating plates 20 are each biased toward the scalability card 30. Accordingly, the scalability connectors 18 of each computer blade 10 are in operative contact with the scalability connectors 39 on the scalability card 30. In this position, the processors in the blades 10 have been successfully interconnected.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system comprising:
a plurality of computer blades releasably securable in a parallel configuration, each computer blade including a circuit board and at least one processor operatively coupled to the circuit board, each processor in electronic communication with a scalability connector on a floating plate that is loosely secured to the computer blade, wherein each scalability connector is disposed in a common plane extending perpendicular to the plurality of parallel computer blades; and
a scalability card including a plurality of electronically interconnected scalability connectors arranged for rough alignment with the scalability connectors of each computer blade, the scalability card further including at least one alignment feature for each floating plate for providing fine alignment of the scalability connector on the floating plate to the scalability connector of the scalability card; and
fasteners for independently biasing each floating plate against the scalability card.

2. The system of claim 1, wherein each scalability connector of the computer blade is linearly aligned in the common plane.

3. The system of claim 1, wherein each scalability connector of the computer blades faces outwardly from the computer blade.

4. The system of claim 1, further comprising:
a load plate backing the scalability card.

5. The system of claim 4, further comprising:
leaf springs disposed between the fasteners and the load plate.

6. The system of claim 1, wherein the alignment features of the scalability cards are pins that engage holes in the floating plates.

7. The system of claim 1, wherein the scalability connectors are land grid array connectors.

8. The system of claim 1, wherein each scalability connector of the computer blades is disposed in a recess formed along an edge of the plurality of parallel computer blades.

9. The system of claim 8, wherein the scalability card is received into the recess.

10. The system of claim 1, wherein the scalability card includes between 4 and 8 scalability connectors.

11. A system comprising:
a plurality of computer blades releasably securable in a parallel configuration, each computer blade including a circuit board and at least one processor operatively coupled to the circuit board, each processor in electronic communication with a scalability connector on a floating plate that is loosely secured to the computer blade, wherein each scalability connector is disposed in a common plane extending perpendicular to the plurality of parallel computer blades; and a scalability card including a plurality of electronically interconnected scalability connectors arranged for rough alignment with the scalability connectors of each computer blade, the scalability card further including at least one alignment feature for each floating plate for providing fine alignment of the scalability connector on the floating plate to the scalability connector of the scalability card, wherein the scalability connectors of the computer blades are formed on a flex cable.

12. The system of claim 11, wherein each of the scalability connectors is a grid array connector.

13. The system of claim 12, wherein the scalability card includes between 4 and 8 scalability connectors.

14. The system of claim 11, further comprising:

a load plate backing the scalability card.

15. The system of claim 11, wherein each scalability connector of the computer blades is disposed in a recess formed along an edge of the plurality of parallel computer blades.

16. A method for processor scaling across a plurality of computer blades, comprising:

providing a plurality of computer blades, each computer blade having a circuit board, a processor operatively connected to the circuit board, and a scalability connector that lies in a plane perpendicular to the computer blade;

releasably securing the plurality of computer blades together with the scalability connector of each computer blade aligned along an edge of the computer blades; and releasably securing a scalability card across each of the scalability connectors of the computer blade, wherein the scalability card includes scalability connectors for coupling with each of the scalability connectors of the computer blade and electronically conductive interconnections between the scalability connectors on the scalability card, wherein each floating plate is independently biased against the scalability card.

17. The method of claim 16, further comprising:

allowing the scalability connector of each computer blade to float within the plane; and urging each scalability connector to independently float into alignment with one of the scalability connectors on the scalability card.

18. The method of claim 17, wherein each of the scalability connectors is a grid array connector.

19. The method of claim 16, wherein the scalability connectors of the computer blades are formed on a flex cable.

20. The method of claim 16, wherein the scalability card includes between 4 and 8 scalability connectors.

\* \* \* \* \*